United States Patent [19]

Okino et al.

[11] Patent Number: 4,952,272

[45] Date of Patent: Aug. 28, 1990

[54] METHOD OF MANUFACTURING PROBING HEAD FOR TESTING EQUIPMENT OF SEMI-CONDUCTOR LARGE SCALE INTEGRATED CIRCUITS

[75] Inventors: Hironobu Okino, Kawasaki; Akio Fujiwara, Chigasaki; Yutaka Akiba, Fujisawa; Susumu Kasukabe, Yokohama; Tsuyoshi Fujita, Yokohama; Masao Mitani, Yokohama; Kazuo Hirota, Chigasaki, all of Japan

[73] Assignee: Hitachi, Ltd., Tokyo, Japan

[21] Appl. No.: 358,252

[22] Filed: May 30, 1989

[30] Foreign Application Priority Data

May 30, 1988 [JP] Japan .................................. 63-130130

[51] Int. Cl.[5] .......................... B44C 1/22; C23F 1/02; C03C 15/00; C03C 25/06

[52] U.S. Cl. .................................. 156/630; 156/626; 156/634; 156/643; 156/652; 156/656; 156/661.1; 204/129.65

[58] Field of Search ............... 156/626, 630, 634, 643, 156/646, 652, 653, 656, 659.1, 661.1, 662, 664; 204/129.1, 129.65; 324/158 R, 158 D, 158 P

[56] References Cited

U.S. PATENT DOCUMENTS

4,585,991   4/1986   Reid et al. .......................... 324/158

Primary Examiner—William A. Powell
Attorney, Agent, or Firm—Kenyon & Kenyon

[57] ABSTRACT

A probe head for use with equipment for testing a semiconductor device such as a large scale integrated circuit (LSI) includes electrode pads are formed on a circuit substrate, and a pad protecting conductive layer formed on the pads. A probe pin forming material is grown which is worked into a pin-like configuration, thereby improving a pin assembling property of a probe head portion and this realizes highly accurate pinning with high reliability.

20 Claims, 6 Drawing Sheets

METHOD OF MANUFACTURING PROBING HEAD FOR TESTING EQUIPMENT OF SEMI-CONDUCTOR LARGE SCALE INTEGRATED CIRCUITS

BACKGROUND OF THE INVENTION

The present invention relates to a probe head of a test probe for use with equipment for testing a semiconductor device such as a Large Scale Integrated Circuit (LSI) and a method of manufacturing the same. More particularly, the present invention relates to a method of manufacturing a probe head that can support a great number of probes with high density of the pins for each probe and a probe head produced by that method.

A probe head is intended to provide contact with an electrode pad of a semiconductor LSI to transmit an electric signal between the LSI and testing equipment to which the probe is connected. A known test probe includes a plurality of probe pins prepared in advance which are individually inserted into through-holes provided in a probe head structure. In order to improve an electrical contact characteristic, a tip portion of a probe pin is required to have a pointed form. A probe pin is first fixedly mounted on a probe head structure, and thereafter a flat surface is obtained by grinding and polishing the pin. The tip of the pin is then semispherically and conically exposed and formed by subjecting the pin to etching. An apparatus of this kind is disclosed in Japanese Patent Application Laid-Open No. 80067/1986.

In the above-described probe head configuration, no consideration has been given to providing a great number of probes or a multi-probe device having a high density of probe pins. A primary concern in the method of forming these probe pins was the need for high precision of pin tip positioning. The probe pins are individually inserted into and assembled on a probe structure having through holes. Therefore, highly accurate insertion and assembling techniques are necessary to provide higher density and multiple probe pins. This technique has certain limitations. A tip of the inserted probe pin, particularly in case of a tip in contact with an electrode pad, a soldering electrode, is springless, and the height and lateral positions thereof need to be arranged and adjusted with high accuracy within a given area (for one tip portion) in order to ensure a contact resistance characteristic between a pin and a pad. In the known configuration, a tip of a probe pin is formed by etching, but with respect to the position of the tip, no consideration has been paid to the necessity of higher precision.

SUMMARY OF THE INVENTION

The present invention provides a probe head which has improved pin assembly properties and realizes a high precision positioning of probe pins with high reliability while solving the aforementioned problem. A method of manufacturing the probe head is also provided by the present invention.

Electrode pads are formed on a circuit substrate and a pad protecting conductive layer is then formed thereon and thereafter a pin probe forming conductive layer is further formed thereon. Then, etching is carried out by use of a mask pattern as desired. In this way, in a great number of probes with high density, a pin assembling property of a probe head portion can be improved.

A surface of a probe substrate to be formed into a tip of a pin is smoothed to form a mask pattern for forming a pin, and undercut or side etching is applied so that a fine flat surface is left in a portion positioned in the central portion of the electrode pad portion. With this, the height of the pin tip portions can he made to be the same level as the smoothed surface of the probe substrate, and in addition, any lateral unevenness can be made to a level close to a dimensional precision of a mask pattern, and therefore a high precisioning of a pin or pins of a probe head portion can be realized.

The present invention provides a probe head for use with test equipment for analyzing semiconductor large scale integrated circuits. The probe head comes into contact with an electrode pad of a semiconductor LSI to act as a conduit of electric signals between the test equipment and the semiconductor LSI.

The probe includes a wiring substrate having opposite surfaces on which are formed a row of electrode pads, where the pads on the apposite surfaces are electrically connected with each other in a specifically arranged relationship. The probe also includes a pad protective conductive layer provided on the electrode pads on the wiring substrates. Also, a polygonal conical probe pin which is worked into a shaped pin after a probe pin material has been grown on the protective conductive layer. The probe pin includes a circle whose base portion is thick and an end having a fine flat surface.

A method of manufacturing a probe head which comes into contact with an electrode pad of a semiconductor LSI to transmit an electric signal to a testing equipment body, includes a first step of preparing a wiring substrate on one surface of which is arrayed electrode pads for forming probe pins while on the back or opposite surface of which is arrayed electrode pads for transmitting an electric signal between the probe and the testing equipment. The electrode pads of the probe pins are electrically connected with electrode pads arranged on the opposite surface of the substrate in a specifically arranged relationship. According to a second step, a pad protecting conductive layer is formed on the electrode pads corresponding to the probe pins. In a third step a probe pin conductive layer for forming the probe pins is laminated and formed on said wiring substrate, including said pad protecting conductive layer, and has a thickness corresponding to a height generally required for the probe. In a fourth step a mask pattern is formed above a said probe pin conductive layer on an area above an electrode pad where a center of the mask pattern is aligned with a center axis of the corresponding electrode pad. In a fifth step the conductive layer is selectively etched using the mask pattern as a mask to thereby form a probe pin and to expose a pad protecting conductive layer formed between the electrode pads. In a sixth step the pad protecting conductive layer exposed in said fifth step is removed and in a seventh step the mask pattern on the probe pin formed in the fourth step is removed.

The method can be modified so that after the third step a surface of the probe pin conductive layer is smoothly worked.

The pad protecting conductive layer includes a good conductor having an etching resisting property when said probe pin conductive layer is subjected to selective etching, and can be formed by a film forming method of deposition, plating, CVD or sputtering.

The probe pin conductive layer is a metal selected from a group including tungsten (W), molybdenum (Mo), Titanium (Ti), Chromium (Cr), Tantalum (Ta), Niobium (Nb), Copper (Cu) - Nickel (Ni) group alloy, Beryllium (Be) - copper (Cu) alloy and copper, and is formed by a film forming method of deposition, plating, CVD or sputtering.

The pad protecting conductive layer and said probe pin conductive layer are laminated and formed so that h=0.5d to 2d, where h represents a height from the wiring substrate of said probe pin, and d represents a pitch between electrode pads at the base of the adjacent probe pins.

The relationship between the height h of the probe pin and the pitch d between the pads is a preferable condition for causing a signal to pass in a satisfactory manner. The value in the range as described above (h=0.5d to 2d) is generally practical though it somewhat differs depending on material constituting a probe pin.

Etching while carrying out side etching by a wet-etching process can be employed as an etching process for selectively etching the probe pin conductive layer using the mask pattern as a mask. Another option is to etch halfway by a dry-etching process and thereafter etching while carrying out side etching by wet-etching process to form an acute probe pin in the form of a polygonal cone including a circle and an ellipse.

The wiring substrate of the probe head of the present invention includes a multi-layer circuit substrate having at least three circuit layers comprising a conduction circuit layer for power supply, a signal input and output layer and a ground layer. The multi-layer circuit substrate includes a ceramic multi-layer laminated plate.

Formation of said probe pin conductive layer determines a height of a resultant probe pin, and therefore, a desired thickness may be formed while taking into account the amount of polishing for flattening a surface, a height of an electrode pad and a pitch between pads. The material of the conductive layer may have hardness to some extent as a probe pin, conductivity (low resistance) and antibrittleness. Generally the aforesaid materials are suitable. However, in the case of using copper as the probe pin conductive layer, its hardness is somewhat insufficient. Therefore, when a probe pin is formed of copper it is desirable to apply a plating process such as nickel, chromium or the like, to the surface of the probe pin. Even in the case where the hardness of the material selected for the probe pin conductive layer is satisfactory, a known suitable plating process may be applied for the purpose of anticorrosion in order to prevent surface-oxidation of a pin to obtain a product with high reliability.

The pad protecting conductive layer includes a good conductor having an anti-etching property (which performs a masking function) when the probe pin conductive layer is subjected to selective etching and can be copper (Cu), nickel (Ni), gold (Au) or the like. A thickness of a film to be formed of the pad protecting conductive layer will be sufficient of it is thick enough to provide a masking function when a probe pin conductive layer is subjected to selective etching. The thickness should be on the order of several tens of $\mu$m. A known film forming technique similar to formation of the probe pin conductive layer can be employed to form the film of the pad protecting conductive layer.

The mask patterns may include a circle, an ellipse and other polygons such as a triangle, a square, a pentagon and the like. Masking materials may include a photo-resist, such as a photo-sensitive resist, or metal mask. Materials which sufficiently provide a masking function when a probe pin conductive layer is subjected to etching will suffice. In the case of metal mask, a film to be a mask material is formed on a probe pin conductive layer by a known film forming technique. First there is a general deposition such as by CVD, sputtering or plating. Then, a photo-resist film selected from a group (including not only those sensitized by ultraviolet ray but also those sensitized by electron beam and X-ray exposure) is formed on the film, and exposure, development and etching are applied thereto to easily form a metal mask pattern as desired. In case of forming a fine pattern, a resist that is sensitized by X-ray rather than ultraviolet ray and by electron beam rather than X-ray can be used as is known. In view of resolution of a resist, a positive type is generally superior to a negative type.

DETAILED DESCRIPTION

Figure 1:
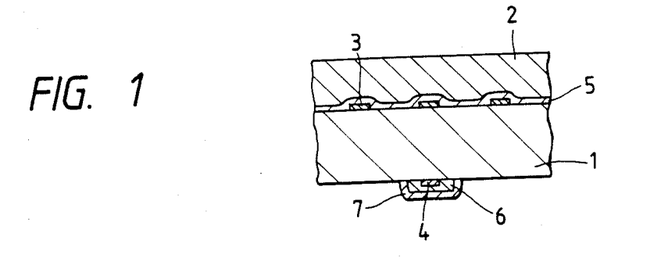
FIG. 1 is a sectional view of a probe head without pins for use with equipment for testing a semiconductor LSI according to a first embodiment of the present invention.

A first embodiment of the present invention will be described hereinafter with reference to FIGS. 1 and 2. FIG. 1 illustrates an embodiment in which a probe pin conductive layer is formed or a multi-layer circuit substrate 1. The multi-layer circuit substrate 1 is composed of a wet thick film ceramic plate. Tungsten electrode pads 3 and 4 are formed on opposite surfaces of the substrate 1. A pad protecting conductive layer 5 is deposited on the electrode pad portion 3 and this protecting conductive layer can be made of copper. A nickel plating 6 and gold plating 7 may be applied to electrode pad portion 4 to form a second pad protecting conductive layer. A probe pin conductive layer 2 is grown on the side of the substrate 1 on which is formed the pad protecting conductive layer 5 by a film forming technique such as electric plating, CVD, sputtering or the like. Tungsten may be used for the probe pin conductive layer 2.

Figure 2A:
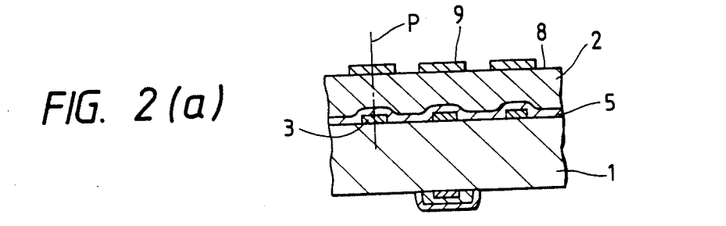
FIGS. 2(a), 2(b) and 2(c) illustrate the steps of manufacturing a probe head with pins according to a first embodiment of the present invention using the probe head of FIG. 1.
Figure 2B:
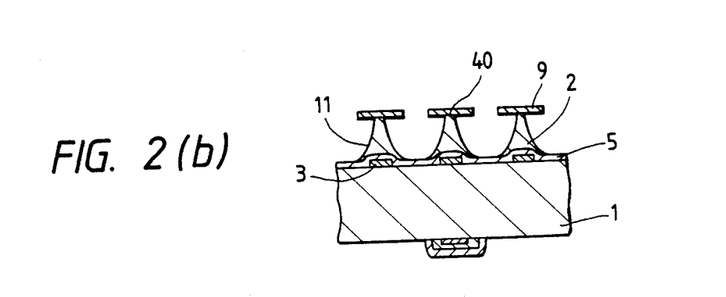
Figure 2C:
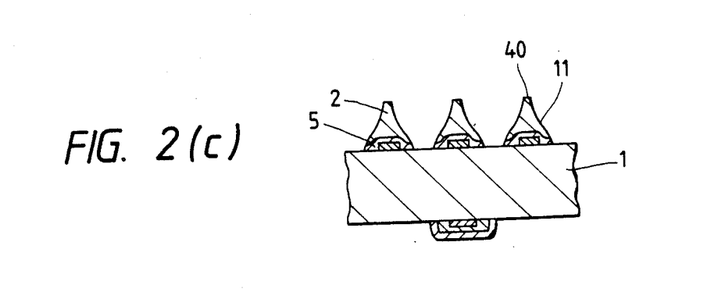

FIGS. 2(a) to 2(c) are respectively sectional views showing the procedure of manufacturing processes for forming multiple pins on the multi-layer circuit substrate 1 formed with the probe pin conductive layer 2 of FIG. 1.

FIG. 2(a) shows the step by which a mask 9 is formed on the probe pin conductive layer 2. First, the surface of the probe pin conductive layer 2 is worked by polishing to approximately 5 $\mu$m on the average to have a smoothed surface 8, after which a mask 9 is formed. The mask 9 may be a metal mask, and a photosensitive resist may be used to form the mask 9. In this embodiment, copper is used as the metal mask. Copper is first deposited on the smooth surface 8. A photosensitive resist is coated on the copper and a circular pattern is exposed and developed after which unnecessary portions are removed. The remaining resist is used as a mask as exposed copper film is etched by a water solution of persulfuric acid ammonium to form a copper mask 9. In this embodiment, as a resist, a positive type ultraviolet ray resist under tradename of OMR-83 made by TOKYO OHKA K.K. was used as the photo-sensitive resist and exposure was carried out by irradiation of the resist with an ultraviolet ray of 400 nm. A center axis of each mask portion 9 is aligned with a center axis P of a corresponding electrode pad portion 3 to develop a pin for each electrode pad portion.

FIG. 2(b) illustrates the step by which the probe pin conductive layer 2 is subjected to selective etching. For example, in the case where tungsten is used as the probe pin conductive layer 2 and copper is used as the mask 9, wet etching is carried out from the surface formed with the mask 9 by a water solution comprising a mixture of potassium hydroxide and red prussiate. At this time, undercut (also called side etching) is positively utilized and controlled whereby a fine flat surface 40 of the probe pin conductive layer 2 is left below the mask 9 in a central portion. At the same time, the neighborhood portion of the electrode pad portion 3 is not removed by etching. At that time, the pad protecting conductive layer 5 is exposed but is made of a material, such as copper, that is not etched by the etching liquid used to etch the probe pin conductive layer 2. As a result, the electrode pad portion 3 is protected from etching. An acute probe pin 11 having a fine flat surface 40 at the tip thereof is formed on the pad protecting conductive layer 5 leaving the mask 9.

FIG. 2(c) shows the step by which the mask 9 and the exposed portions of the pad protecting conductive layer 5 are removed. In the case where copper is used as material for both the mask 9 and the pad protecting conductive layer 5, they can be simultaneously removed by a water solution of persulfuric acid ammonium. By removing the exposed portions of the pad protecting conductive layer 5 the pins of the probe 11 are electrically isolated from one another. Materials other than tungsten, as previously mentioned, can be used for probe pins 11. In the case of using copper for layer 2, chromium may be used for the pad protecting conductive layer 5 and the mask 9. In this case, an etchant such as a potassium ferricyanide water solution is used to etch the chromium mask 9 and chromium pad protecting layer 5.

In case of the above-described embodiment, the pitch of the electrode pad 3 is 350 μm, the probe pin conductive layer 2 is 300 μm and the pad protecting conductive layer 5 is 5 μm, whereby 300 probe pins can be collectively formed on the probe head. A probe head having probe pins whose height varies less than 1 μm and with height arranged with high accuracy could be manufactured. In the case of prior art employing an individual pin assembling system which is not a collective forming system with the similar number of probe pins to the former, the unevenness of the height of the probe pins was approximately 30 μm.

According to the present embodiment, in a great number of probes with high density of probe pins, multiple pins with high density and high quality can be formed on the electrode pad portion of the circuit substrate, and therefore, there is an effect of considerably improving the assembling property.

Furthermore, the unevenness of height of pin tip portions can be made to the same level as that of the smooth surface of the probe substrate and the lateral unevenness can be made to a level close to a dimensional accuracy of a mask pattern, and therefore there is an effect of considerably improving the positional accuracy of the pin tip position of the probing head portion.

FIG. 3 illustrates the steps of manufacturing multiple pins on a multi-layer circuit substrate 1 according to a second embodiment of the present invention.

Figure 3A:
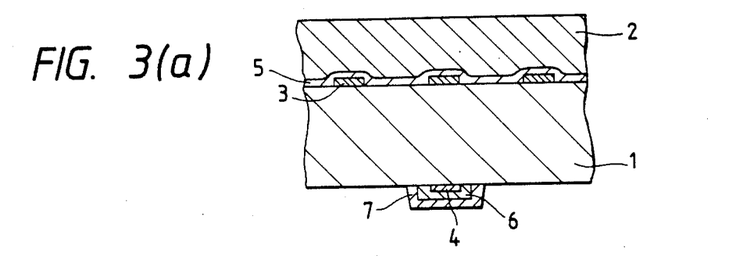
FIGS. 3(a), 3(b) and 3(c) illustrate the steps of manufacturing a probe head according to a second embodiment of the present invention.

FIG. 3(a) shows the step by which a probe pin conductive layer 2 is formed on a multi-layer circuit substrate 1 having a conduction circuit layer for power supply, a signal circuit layer (input and output) and a ground layer. The multi-layer circuit substrate 1 comprises a wet type thick film ceramics plate, with tungsten electrode pad portions 3 and 4 formed on opposite surfaces of the substrate. The tungsten electrode pad portions 3 and 4 are electrically connected with each other through a circuit structure (not shown). The circuit allows signals to flow between the test equipment and the pins of the probe which are to contact the LSI. A pad protecting conductive layer 5 such as copper is deposited on the electrode pad portion 3. A nickel plating 6 and a gold plating 7 are applied to the electrode pad portion 4. The probe pin conductive layer 2 is grown on a portion on which the pad protecting conductive layer 5 is formed by a film forming technique, for example, such as electric plating, CVD, and sputtering. In this case, tungsten was used as a material for the probe pin conductive layer 2. The basic structure is therefore similar to that of FIG. 1

Figure 3B:
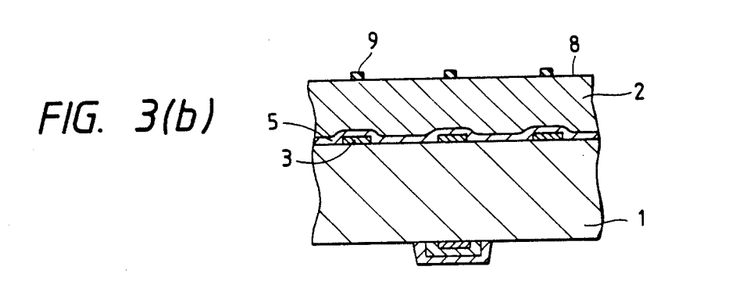

FIG. 3(b) illustrates the step by which a first mask 9 is formed on the probe pin conductive layer 2. First, the surface of the probe pin conductive layer 2 is worked by polishing or the like to form a smooth surface 8, after which a mask 9 is formed. The mask 9 may be of a metal mask, and a photo resist may be used as a mask for producing the metal mask 9. In this case, nickel (Ni) is used for the metal mask. Nickel is first deposited on the smooth surface 8, and a photosensitive resist is coated on the nickel and a circular pattern of the photo-resist is subjected to exposure and development and thereafter unnecessary portions are removed. Exposed portions of the nickel film are then subjected to etching by a water solution of nitric acid, using the remaining photo-resist as a mask, to form a nickel mask 9. The center axis of the electrode pad portion 3 and that of the mask 9 are aligned. Rather than nickel the metal mask 9 could be made of platinum (Pt), palladium (Pd), nickel-chormium alloy, and so forth.

Figure 3C:
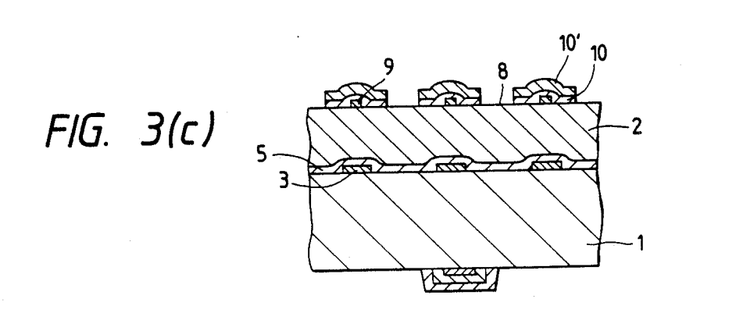

FIG. 3(c) illustrates the step by which a concentric circular second mask is formed on the first mask 9 and has a larger diameter than that of the first mask 9. In the case where nickel is used for the mask 9, the mask 10 may be of a metal mask, and a photosensitive resist may be used to form this second metal mask. In this example, since copper is used for the mask 10, copper is deposited on the whole surface and a photosensitive resist 10' is coated on the copper. A pattern of the photo-resist as desired is subjected to exposure and development and thereafter unnecessary portions are removed. Exposed portions of the copper film are subjected to etching by a water solution of persulfuric acid ammonium using the remaining photo-resist 10' as a mask to form a copper second mask 10. Also in this case, the center axis of the electrode pad portion 3 that of the second mask 10 are aligned. In the case where a metal mask is used as the mask 10, the photo-resist remaining on the mask 10 may be or may not be removed. It is important that the first mask 9 and the second mask 10 have the selectivity in the post-etching step. That is, it is necessary to be able to remove the mask 10 while not affecting the mask 9, and therefore, the selectivity becomes necessary.

Figure 3D:
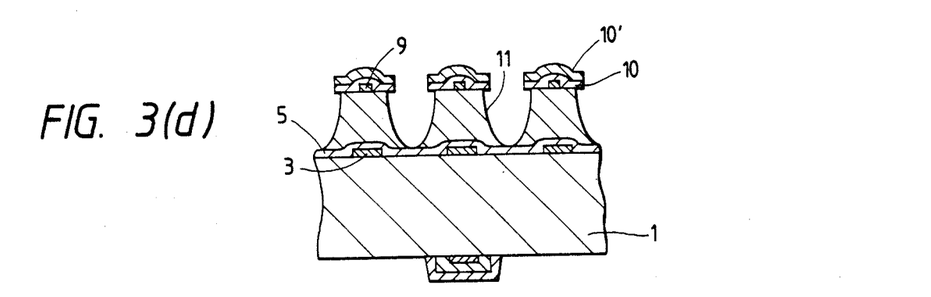

FIG. 3(d) illustrates the step by which the etching step of the probe pin conductive layer 2 in the first stage has been completed. For example, in the case where tungsten is used as material for the probe pin head conductive layer 2 and copper is used for a mask 10, the surface on which mask 10 is formed is subjected to electrolytic etching using a water solution comprising a mixture of KOH and $K_3Fe(CN)_6$. The condition of the electrolytic etching is controlled whereby undercut and side etching are positively utilized to remove portions of the probe pin conductive layer 2 leaving a portion in the vicinity of the electrode pad portion 3 so as to have the desired shape. At this time, a part of the pad protecting conductive layer 5 is exposed, but is made of such a material that it is not etched by the etching liquid used to etch the probe pin conductive layer. For example, copper can be used as the pad protecting conductive layer to protect the electrode pad portion 3 from etching. As a result, a first stage etching surface 12 is formed on the pad protecting conductive layer 5 leaving the mask 10 thereon.

While etching the probe pin conductive layer 2 in the first stage as described above, etching has been conducted to the depth at which a part of the pad protecting conductive layer 5 as a backing is exposed. It is noted that it is not always exposed. Since this etching is conducted for rough pin working, it can remain unexposed.

Figure 3E:
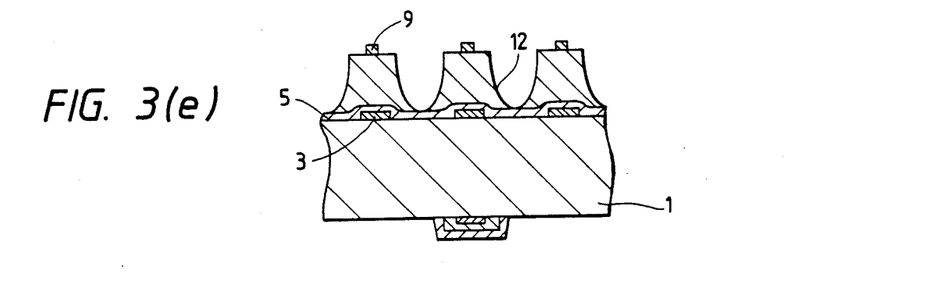

FIG. 3(e) illustrates the step by which the second mask 10 is removed. In the case where copper is used for the mask 10, it is removed using a water solution of persulfuric acid ammonium. At this time, when a resist remains on the mask 10, the resist is first removed and the mask 10 is then removed.

Figure 3F:
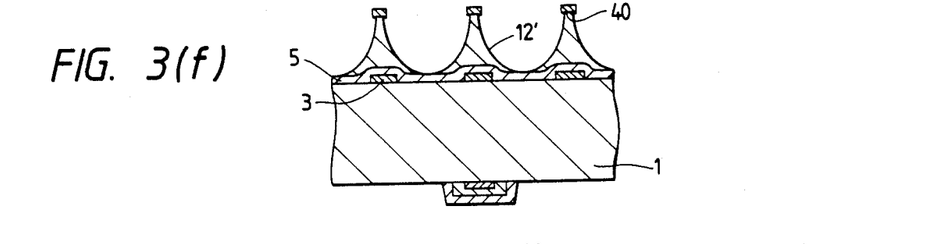

FIG. 3(f) shows the step by which an etching step in a second stage is completed. Similar to the etching step in the first stage shown in FIG. 3 (d), the surface on which the first mask 9 is formed is subjected to electrolytic etching using a water solution comprising a mixture of KOH and $K_3Fe(CN)_6$. The condition of the electrolytic etching is controlled whereby undercut is positively utilized to remove portions of the probe pin conductive layer 2 leaving a portion in the vicinity of the electrode pad portion 3 so as to have a shape as desired. As a result, a second stage etching surface 12' having a fine flat surface 40 at the tip thereof is formed on the pad protecting conductive layer 5 leaving the first mask 9 thereon.

Figure 3G:
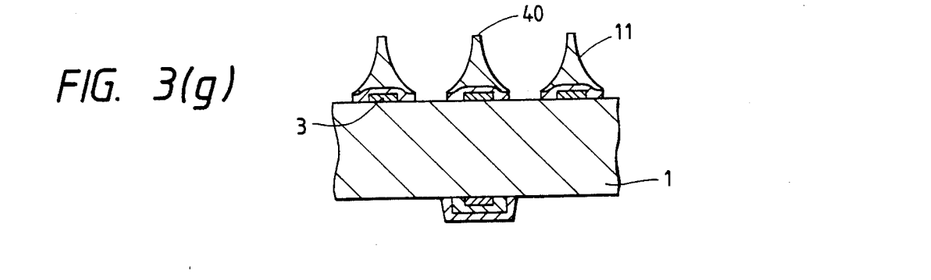

FIG. 3(g) shows the step by which the first mask 9 and exposed portions of the pad protecting conductive layer 5 are removed. In the case where nickel is used for the mask 9, it can be removed by a water solution of nitric acid. In the case where copper is used for the pad protecting conductive layer 5, it can be removed by a water solution of persulfuric acid ammonium. That is, the removal of the exposed portion of the pad protecting conductive layer 5 is made by self-matching etching with a base of the probe pin 11 being a mask. Thereby, the pins 11 are electrically separated from one another when the exposed portions of the pad protecting conductive layer 5 are removed. Thereafter, a plated film of gold or rhodium can be formed on the surface of the pin 11 to stabilize and improve the electric contact characteristics. Alternatively, copper may be used as a material to constitute the masks 9 and 10, and a separation layer between the masks 9 and 10 may be formed on the surface of the mask 9 by deposition or plating of chromium. Other materials may be used for the pin 11. For example, in the case where copper or copper alloys (for example, copper-nickel group alloy) are used, chromium is used for the pad protecting conductive layer 5 and mask 9, and silver (Ag), titanium (Ti) or the like is used for the mask 10. In addition to those mentioned above, as masks 9 and 10, Mo, Ti, Ta, Nb, Mg, Si, $SiO_2$, $Si_3N_4$ and the like may be used. As materials for the pin 11, Mo, Ti, Cr, Ta, Nb, Ni, Cu-Be group alloy, and copper group may be used. However, when choosing cooper, the surface is plated by metal harder than copper.

According to this second embodiment, in the step of selective etchinq and forming a conductive layer for a probe using a wet etching process, a mask is doubly formed with a film having a large and small sizes to form a pin shape by two masks, a large mask and a small mask. First there is shaping using the large mask. Subsequently, the large mask is removed and a dimension of a pin tip portion is controlled by a first small mask to thereby control a pin shape. The etching step is controlled so that a fine flat surface remains in the pin tip to collectively form it whereby a probe head having a shape as desired can be realized. Moreover, it is also possible to considerably improve the proportion of the height of the pin tip portion with respect to the probe diameter without impairing the assembling property and the positional precision of the pin tip of the probe head portion.

FIG. 4 illustrates the step of manufacturing multiple pins on a multi-layer circuit substrate 1 according to a third embodiment of the present invention. FIG. 4(a) illustrates a step of metallizing a multi-layer circuit substrate 1 having a conduction circuit layer for power supply, a signal circuit layer (input and output) and a ground layer and a conductive sheet 2. The multi-layer circuit substrate 1 comprises a wet type thick film ceramics plate. Nickel plating 6 and gold plating 7 are applied to tungsten electrode pad portions 3 and 4 formed on opposite surfaces of the substrate 1.

Figure 4A:
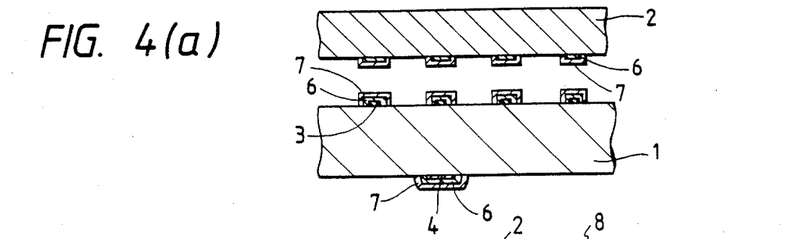
FIGS. 4(a), 4(b) and 4(c) illustrate the steps of manufacturing a probe head according to a third embodiment of the present invention.

On the other hand, the conductive sheet 2 is formed of tungsten, and nickel plating 6 and gold plating 7 are applied by a pattern on one surface thereof and positioned to correspond to the electrode pad portion 3 on the surface of substrate 1. The electrode pad portion 3 is electrically connected to the electrode pad portion 4 enlarged by an internal circuit (not shown) of the multilayer circuit substrate 1 so that signals can pass between test equipment and the probe pins.

Figure 4B:
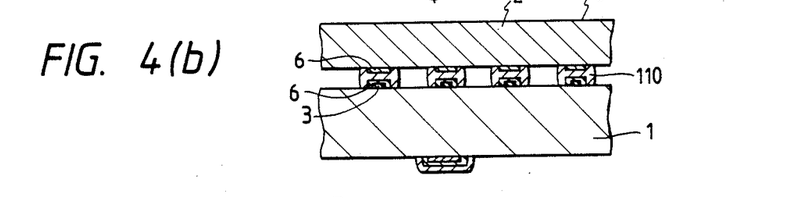

FIG. 4(b) illustrates a step by which a multi-layer circuit substrate 1 and a conductive sheet 2 are brazed. A gold plating 7 formed on a nickel plating 6 on the electrode pad portion 3 of the multi-layer circuit substrate 1 and a gold plating 7 formed on a nickel plating 6 the conductive sheet 2 are opposedly adjusted in position so that corresponding patterns are placed one over another and thereafter heated and pressed together to thereby form a brazed portion 110 of gold (Au)-gold (Au). Particularly, the opposed surface of the conductive sheet 2 not formed with the brazed portion 10 presents a flat surface 8 during heating and pressing. The flat surface 8 formed on the conductive sheet 2 can be further improved in flatness by polishing or the like after an insulative retainer is added after completion of brazing as later described.

Figure 4C:
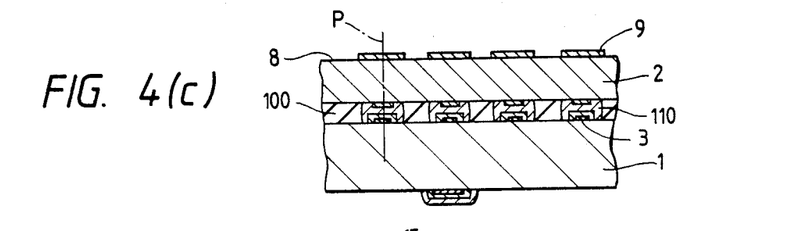

FIG. 4(c) illustrates a step of filling and solidifying a polyimide resin as an insulative retainer 100 in a gap of the brazed portion 110 and the step of forming a metal mask 9 on the flat surface 8 of the conductive sheet 2.

In the step of filling and solidifying the insulative retainer 100, the polyimide resin is filled in the aforesaid gap and can be easily solidified by heating it to 350° C., for example. In place of the polyimide resin, for example, a plastic silicone resin is filled and heated then an insulator mainly comprising $SiO_2$ can be easily filled and solidified.

Next, as the step of forming the mask 9, copper is evenly deposited on the flat surface 8 of the conductive sheet 2 formed of tungsten. Subsequently, a photosensitive resist is coated thereon by a spinner, and a desired pattern is exposed and developed by use of a quartz mask or the like. In this example, as a resist, a negative type ultraviolet resist of trade name OMR-83 manufactured by TOKYO OHKA CO., LTD. was used, and exposure was conducted by irradiation of the result with ultraviolet rays of about 400 nm. Then, unnecessary resist is removed, and a copper film is subjected to etching by a water solution of persulfuric acid ammonium to form a copper metal mask 9. This metal mask 9 normally has a shape of a circular pattern but various other shapes, including a polygon, may be used in order to control a shape of a pin tip in the later steps. The center position of the electrode pad portion 3 formed on the multi-layer circuit substrate 1 and the center axis P of the metal mask 9 are aligned.

Figure 4D:
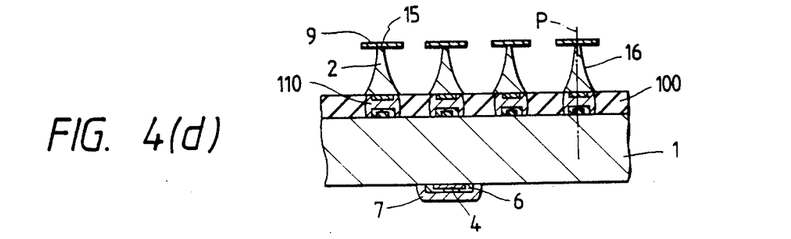

FIG. 4(d) illustrates a step by which selective etching is conducted for the conductive sheet 2. The conductive sheet 2 formed of tungsten is subjected, from the surface on which a copper metal mask 9 is formed, to wet etching using a water solution comprising a mixture of KOH and $K_3Fe(CN)_6$. At this time, undercut and side etching are positively utilized and controlled whereby a flat surface 15 of the conductive sheet 2 is formed below mask 9 in a central portion of the metal mask 9 and at the same time, portions of the conductive sheet 2 are removed leaving a portion in the vicinity of the brazed portion 110. As a result, an acute pin 11 having a fine flat surface 15 at the tip thereof is formed on the brazed portion 110 of the multi-layer substrate 1 leaving the metal mask 9 thereon. In order that the pin 11 stands upright, the metal mask 9 need be registered with the center axis P of the brazed portion 110.

Figure 4E:
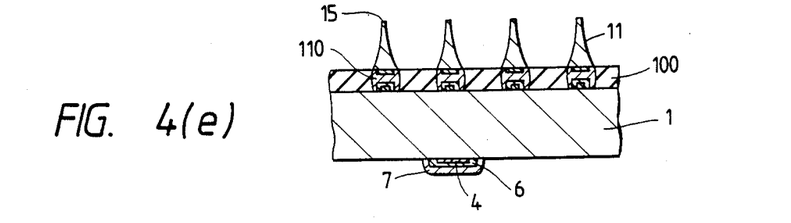

FIG. 4(e) illustrates a step by which a metal mask 9 remaining on the tip of the pin 11 is removed. The copper metal mask 9 is removed by a water solution of persulfuric acid ammonium. Thereby, the manufacturing process of forming multiple pins on the multi-layer circuit substrate 1 is fundamentally completed to obtain a probe head as intended. While tungsten has been used as a material of the conductive sheet 2 to form the pin 11, other metals can be used so long as a etching solution such as water solution is selected which does not etch the metal mask 9 and brazed portion 110. For example, in the case where copper is used for the conductive sheet 2, chromium is used for the metal mask 9. At this time, etching liquids of copper and chromium used are a water solution of persulfuric acid ammonium and a water solution of potassium ferricyanide. A plating film of gold and rhodium is formed on the surface of the pin 11 whereby an electric contact characteristic between an electrode pad (soldering electrode) of a semiconductor wafer (tip) and the pin 11 can be stabilized and improved.

FIG. 5 illustrates the steps of the manufacturing process for forming multiple pins on a multi-layer circuit substrate according to a fourth embodiment of the present invention.

Figure 5A:
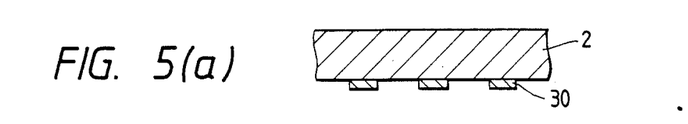
FIGS. 5(a) to 5(g) illustrate the steps of manufacturing a probe head for testing equipment of semiconductor LSI according to a fourth embodiment of the present invention.

FIG. 5(a) illustrates a step by which a mask 30 is formed on a probe head forming material (conductive sheet) 2. After the side of the conductive sheet 2 to be connected to the multi-layer circuit substrate 1 has been flattened, the mask 30 is formed having a center position the same as the electrode pad portion 3 on the multi-layer circuit substrate 1. The mask 30 may be a metal mask, and a photosensitive resist may be used to form the metal mask. For example, in the case where tungsten is used as a material for the conductive sheet 2 and in the case where copper is used for the mask 30, copper is deposited on the flat surface, a photosensitive resist is coated thereon, a desired pattern (preferably, a shape similar to the electrode pad 3 on the multi-layer circuit substrate) is exposed and developed, after which unnecessary portions of resist are removed, and a copper film is subjected to selective etching by a water solution of persulfuric acid ammonium using the photo-resist as a mask to form a mask 30 formed of copper.

Figure 5B:
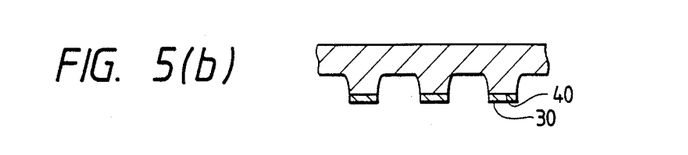

FIG. 5(b) illustrates a conductive sheet after a step of selective etching for effecting dry or wet etching which is intense in vertical anisotropy to form a flat surface 40 (which serves as an electrode pad). For example, in the case where tungsten is used for the conductive sheet 2 and copper is used for the mask 30, the surface on which mask 30 is formed is subjected to dry or wet etching which is intense in vertical anisotropy. For example, for the dry etching, $CF_4+O_2$ or the like is used for an etching gas. For the wet etching, electrolytic etching using a water solution comprising a mixture of KOH and $K_3Fe(CN)_6$ is effected.

Figure 5C:
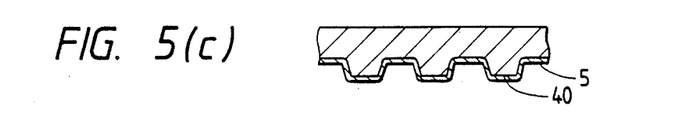

FIG. 5(c) illustrates a step by which a pad protecting conductive layer 5 is formed on a conductive sheet 2 already subjected to etching. After a mask 30 has been removed, for example, copper as a pad protecting conductive layer 5 is deposited. It is noted that this step may be omitted.

Figure 5D:
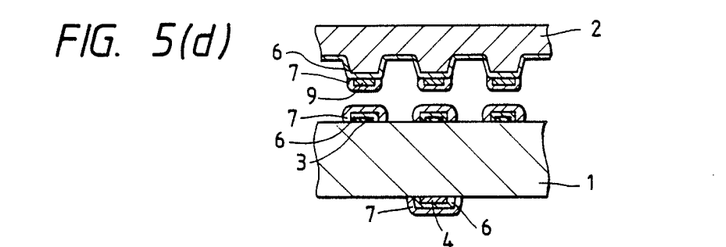

FIG. 5(d) illustrates a step by which a multi-layer circuit substrate 1 and a conductive sheet 2 are metallized. The multi-layer circuit substrate 1 comprises a wet type thick film ceramics plate. A nickel plating 6 and a gold plating 7 are applied to tungsten electrode pad portions 3 and 4 which are formed on opposite surfaces of the substrate.

On the other hand, on the surface of the conductive sheet 2 subjected to etching, a nickel plating 6 and a gold plating 7 are applied by a desired pattern to a position 40 corresponding to the electrode pad portion 3. The electrode pad portion 3 is electrically connected to an electrode pad portion 4 enlarged by internal circuit of the multi-layer circuit substrate 1 that signals may be passed between test equipment and probe pins.

Figure 5E:
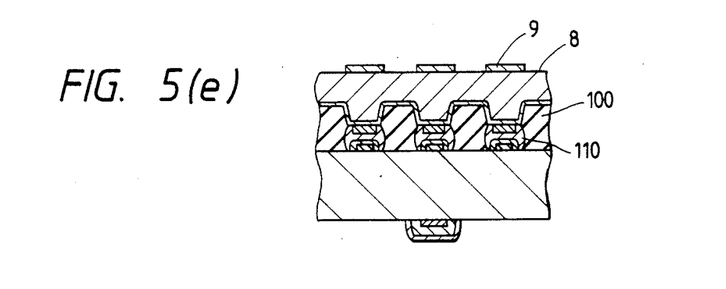

FIG. 5(e) illustrates a step of brazing a multi-layer circuit substrate 1 and a conductive sheet 2 and the step of forming a mask 9. A metal plating 7 formed on an electrode pad portion 3 of the multi-layer circuit substrate 1 and a metal plating 7 formed on the conductive sheet 2 are adjusted in position so that corresponding patterns are placed one over the other and thereafter heated and pressed to thereby form a brazed portion 110 of Au-Au. At that time, an insulative retainer 100 is filled in a gap of the brazed portion 110 in a manner similar to that shown in FIG. 4(c). As a material for the retainer, for example, $SiO_2$ or the like is used. The surface of the conductive sheet 2 not formed with the brazed portion 110 presents a flat surface 8 during heating and pressing. The smoothness of the flat surface 8 formed on the conductive sheet 2 can be further improved by polishing or the like after brazing.

Next, a mask 9 is formed on the flat surface 8. The mask 9 may be a metal mask, and a photosensitive resist may be used as a mask to form the metal mask. For example, in the case where copper is used for the mask 9, copper is deposited on the flat surface 8, on which is coated a photosensitive resist, a desired pattern is exposed and developed after which unnecessary portions are removed, and a copper film is subjected to etching by a water solution of persulfuric acid ammonium using the resist as a mask to form a copper mask 9. The center axis of the electrode pad portion 3 and that of the mask 9 are aligned.

Figure 5F:
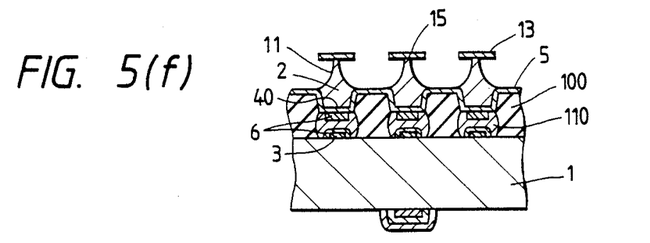

FIG. 5(f) illustrates a step by which selective etching of a conductive sheet 2 is completed. For example, in the case where tungsten is used for the conductive sheet 2, and copper is used for the mask 9, the surface formed with the mask 9 is subjected to electrolytic etching using a water solution comprising a mixture of KOH and $K_3Fe(CN)_6$. The condition of the electrolytic etching is controlled whereby the undercut (side etching) is positively utilized to form a fine flat surface 15 of the conductive sheet 2 below mask 9 in a central portion of the mask 9 and at the same time leaving a portion of the conductive sheet 2 in the vicinity of a flat surface 40 which serves as an electrode pad portion so that a shape of a pin assumes a polygonal conical shape including a circle. At this time, if the step of adding a pad protecting conductive layer of FIG. 5(c) was carried out, that layer 5 is exposed. A material which is not subjected to etching by liquid, for example, copper in this case is used as the protecting conductive layer whereby the brazed portion 110 can be protected from etching. In the case where the step of FIG. 5(c) was omitted, the brazed portion 110 can be protected from etching by the retainer 100. As a result, an acute pin 11 having a fine flat surface 15 in the tip thereof is formed on the pad protecting conductive layer 5 leaving the mask 9 thereon.

The etching of the conductive sheet 2 for forming pins 11 comprises not only wet etching using an etching liquid as described above but a combination of wet etching and dry etching excellent in anisotropical etching, whereby precision and a higher speed of etching can be attained.

Figure 5G:
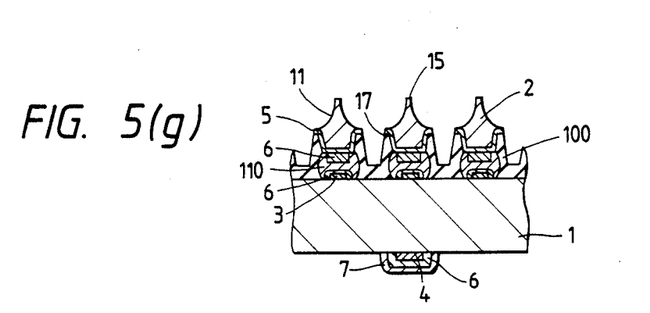

FIG. 5(g) illustrates the step by which exposed portions of a mask 9 and a pad protecting conductive layer 5 are removed. In the case where copper is used for both the elements, they can be simultaneously removed by a water solution of persulfuric acid ammonium. Thereby, pins 11 are electrically separated from one another. In the case where the step disclosed in connection with FIG. 5(c) is not carried out, the pin 11 is electrically separated after the step of FIG. 5(f). Subsequently, the exposed portion of the retainer 100 is subjected to etching to a depth in the vicinity of the brazed portion 110 to form a groove 17. The etching of the retainer 100 preferably comprises anisotropical etching which is high in etching speed depthwise, for example, dry etching. Thereby, the proportion of the height of the pin tip with respect to the diameter of a probe can be considerably improved as compared with the above-described third embodiment of FIG. 4 in which selective etching is not made on the side of the opposed electrode pad portions 3. At that time, the brazed portion 110 is protected from etching by the retainer 100. Material for the pin 11 may comprise those other than the aforementioned tungsten. For example, in the case where copper is used as the pin material, chromium is used for the pad protecting conductive layer 5 and mask 9. In this case, the etching liquid of the chromium portions may comprise a potassium ferricyanide water solution.

According to the fourth embodiment, since a multiplicity of pins with high density can be collectively formed on the electrode pad of the circuit substrate, assembling properties can be advantageously improved.

Moreover, the height unevenness of the pin tip can be made to the same level as that of the flat surface of the conductive sheet and the lateral unevenness can be made to a level close to the dimensional accuracy of a mask pattern. Therefore, the positional accuracy of the pin tip of the probing head can be considerably improved.

Furthermore, the whole exposed surface from the peripheral edge of the thick base of the probe pin to the circuit substrate is covered with and protected by the insulative retainer, and therefore, reinforcement of the pins is stabilized and the insulating property between the adjacent pins may be improved as well as improvement in reliability.

As mentioned above, according to the present invention, it is possible to provide a probe head in which a pin assembling property in a probe head is improved and high precision pinning with high reliability is realized by a method for manufacturing the same.

What is claimed is:

1. A method of manufacturing a probing head for testing equipment of semiconductor large scale integrated circuits (LSI), wherein the probing head comes into contact with an electrode pad of the semiconductor LSI to transmit an electric signal to a testing equipment body, the method comprising the steps of:

preparing a multilayer circuit substrate accommodating therein a structure of multilayer circuit and in which electrode pad patterns are provided in a predetermined spaced relation on opposite surfaces thereof;

coating and forming a pad protecting conductive layer on one surface of said multilayer circuit substrate;

forming a probe pin conductive layer on said pad protecting conductive layer and flattening said surface;

forming a first mask pattern having a center axis registered with said electrode pad on said probe pin conductive layer;

forming a second mask pattern having a larger diameter of a hole than that of said first mask pattern on said first mask pattern, said second mask pattern being formed concentric with said first mask pattern;

applying a first stage etching to said probe pin conductive layer using said second mask pattern as a mask to form a rough pin shape;

removing said second mask pattern, applying a second stage etching and controlling a dimension of said pin tip and a peripheral edge of an electrode pad at a base; and removing said first mask pattern and etching and removing an exposed portion of said pad protective layer in a self-matching manner using said pin base as a mask.

2. The method according to claim 1, further comprising, applying incorrosive metal plating to the pin surface after said step of removing.

3. The method according to claim 1, wherein said first mask pattern and said second mask pattern are formed by those having a selectivity with respect to an etching liquid for said probe conductive layer.

4. A method of manufacturing a probing head for testing equipment of semiconductor large scale integrated circuits (LSI), the method comprising the steps of:

preparing a circuit substrate having one surface arrayed with electrode pads for forming a probe pin while the back thereof is arrayed with electrode pads for transmitting an electric signal between the electrode pads of the testing equipment and said LSI, said pads on both the surfaces being electrically connected with each other in a specific arraying relation;

forming a pad protecting conductive layer on the electrode pads for forming at least said probe pin;

laminating and forming a probe pin conductive layer having a thickness corresponding to a height required for the probe on said circuit substrate including said pad protecting conductive layer;

forming a mask pattern with a center of the mask pattern registered in position with a center axis of the electrode pad for forming said probe pin;

selectively etching said probe pin conductive layer using said mask pattern as a mask to thereby form a probe pin and expose a pad protecting conductive layer between said pads;

removing the pad protecting conductive layer exposed by said of selectively etching; and removing a mask pattern on the probe pin formed by said step of forming a mask pattern.

5. The method according to claim 4, wherein in the selective etching of said probe pin conductive layer, said pad protecting conductive layer comprises a good conductor having an etching resistance and is formed by a film forming method such as deposition, plating, CVD or sputtering.

6. The method according to claim 4, wherein said probe pin conductive layer comprises any one kind of metal selected from the group consisting of W, Mo, Ti, Cr, Ta, Nb, Cu-Ni group alloy, Ba-Cu alloy and copper, and is formed by a film forming method such as deposition, plating, CVD or sputtering.

7. The method according to claim 4, wherein said pad protecting conductive layer and said probe pin conductive layer are laminated so that an equation h=0.5 to 2d is fulfilled, wherein h represents a height from the circuit substrate of said probe pin, and d represents a pitch between the base electrode pads of the adjacent probe pins.

8. The method according to claim 4, wherein using said mask pattern as a mask, said probe pin conductive layer is subjected to selective etching for etching process and is subjected to etching while effecting side etching by a wet etching method, or subjected to etching halfway by dry etching after which is subjected to etching while effecting side etching by a wet etching method to form a polygonal conical acute probe pin including a circle and an ellipse.

9. The method according to claim 1, wherein said circuit substrate comprises a multi-layer circuit substrate having at least three circuit layers comprising a conduction circuit layer for power supply, a signal input and output layer and a ground layer.

10. The method according to claim 9, wherein said multi-layer circuit substrate comprises a ceramics multi-layer laminated substrate.

11. The method according to claim 4, further comprising smoothing the surface of said probe pin forming conductive layer after lamination and forming said probe pin forming conductive layer.

12. A method of manufacturing a probing head for testing equipment of semiconductor large scale integrated circuits (LSI) comprising the steps of:

preparing a circuit substrate having one surface formed with a row of electrode pads for fixing by inserting a probe pin and the back formed with a row of electrode pads connected to the testing equipment, said electrode pads on both the surfaces being electrically connected with each other in a specific arraying relation;

forming a row of electrode pads having patterns corresponding to that of a row of electrode pads for fixing by inserting the probe pin of said circuit substrate on one surface of a conductive sheet;

placing said both rows of pads in opposed relation to secure said conductive sheet to said circuit substrate;

filling and solidifying an insulative retainer in a gap between said circuit substrate and said conductive sheet secured by said step;

polishing smoothly the other surface of said conductive sheet as desired and thereafter forming a polygonal mask pattern including a circle, the center position of which is the same as each pad of said both rows of electrode pads on the surface of said conductive sheet;

subjecting said conductive sheet to selective etching using said mask pattern as a mask to thereby form a row of polygonal conical acute pins including a circle corresponding to said row of electrode pads; and removing said mask.

13. The method according to claim 12, wherein said conductive sheet comprises any one kind of metal selected from the group consisting of W, Mo, Ti, Cr, Ta, Nb, Ni-Cu alloy, Be-Cu alloy and Cu, and said mask comprises a metal or photo resist capable of withstanding selective etching of said conductive sheet.

14. The method according to claim 12, wherein in the step of placing both the rows of pads in opposed relation to secure said conductive sheet to said circuit substrate through a conductive layer, both the pads are coated in advance with metal brazing material, and both the rows of pads are fixed by the brazing.

15. The method according to claim 14, wherein gold (Au) is used as said brazing material.

16. The method according to claim 12, wherein the etching process in the step of selective etching said conductive sheet using said mask pattern as a mask comprises using a wet etching method to effect etching while carrying out side etching or using dry etching to effect etching halfway widthwise direction, and thereafter using a wet etching method to effect etching while carrying out side etching or using wet etching to effect side etching, after which effecting etching in a widthwise direction by dry etching to form a row of polygonal conical acute pins including a circle of a height of the desired probe pin.

17. The method according to claim 12, wherein in the step of forming a row of electrode pads of said conductive sheet, a mask having a predetermined pattern is formed on one surface of said conductive sheet, said conductive sheet being subjected to selective etching to the desired depth to form in advance a convex surface on one surface of said conductive sheet to provide an electrode pad.

18. The method according to claim 17, wherein in the step of filling and solidifying an insulative retainer in a gap between said circuit substrate and said conductive sheet, said insulative retainer to be filled and solidified comprises a plastic organic high polymer resin or inorganic insulator.

19. The method according to claim 18, wherein as said organic high polymer resin, one of the group of polyimide resin, polyamide resin, epoxy resin and silicone resin is filled in said gap and heated and solidified.

20. The method according to claim 18, wherein as said inorganic insulator, a low melting point glass is molten and filled in said gap, and heated and solidified whereby an insulator containing silica ($SIO_2$) as a main component is filled.

* * * * *

UNITED STATES PATENT AND TRADEMARK OFFICE
CERTIFICATE OF CORRECTION

PATENT NO. : 4,952,272

DATED : 28 August 1990

INVENTOR(S) : Hironobu OKINO et al.

It is certified that error appears in the above-identified patent and that said Letters Patent is hereby corrected as shown below:

| Column | Line | |
|---|---|---|
| ABS. | 3 | After "pads" delete "are". |
| 2 | 6 | After "can" change "he" to --be--. |
| 2 | 20 | Change "apposite" to --opposite--. |
| 3 | 60 | Change "of" to --if--. |
| 4 | 44 | Change "or" to --on--. |
| 6 | 40 | After "may be" delete "of". |
| 6 | 59 | After "may be" delete "of". |
| 7 | 2 | After "3" insert "and". |
| 8 | 19 | Change "cooper" to --copper--. |
| 8 | 24 | After "having" delete "a". |
| 8 | 63 | After "6" insert --of--. |

UNITED STATES PATENT AND TRADEMARK OFFICE
CERTIFICATE OF CORRECTION

PATENT NO.  : 4,952,272
DATED       : August 28, 1990
INVENTOR(S) : Hironobu Okino, et al.

It is certified that error appears in the above-identified patent and that said Letters Patent is hereby corrected as shown below:

| Column | Line |  |
|--------|------|--|
| 9  | 14 | After "heated" insert --,--. |
| 9  | 61 | Before "etching" change "a" to --an--. |
| 9  | 66 | Before "copper" change "of" to --for--. |
| 14 | 3  | After "claim" change "1" to --4--. |
| 14 | 66 | After "halfway" insert --in the--. |

Signed and Sealed this

Fourth Day of February, 1992

Attest:

HARRY F. MANBECK, JR.

*Attesting Officer*     *Commissioner of Patents and Trademarks*